United States Patent
Hasegawa

(10) Patent No.: US 11,379,310 B2
(45) Date of Patent: Jul. 5, 2022

(54) ANOMALY DETECTOR

(71) Applicant: KABUSHIKI KAISHA TOKAI RIKA DENKI SEISAKUSHO, Aichi (JP)

(72) Inventor: Akira Hasegawa, Aichi (JP)

(73) Assignee: KABUSHIKI KAISHA TOKAI RIKA DENKI SEISAKUSHO, Aichi (JP)

( * ) Notice: Subject to any disclaimer, the term of this patent is extended or adjusted under 35 U.S.C. 154(b) by 0 days.

(21) Appl. No.: 17/232,655

(22) Filed: Apr. 16, 2021

(65) Prior Publication Data

US 2021/0326209 A1 Oct. 21, 2021

(30) Foreign Application Priority Data

Apr. 21, 2020 (JP) .............................. JP2020-075208

(51) Int. Cl.

| | |
|---|---|
| *G06F 11/00* | (2006.01) |
| *G06F 11/14* | (2006.01) |
| *G11C 7/20* | (2006.01) |
| *G11C 7/10* | (2006.01) |
| *G06F 11/07* | (2006.01) |
| *G06F 11/22* | (2006.01) |
| *G11C 29/10* | (2006.01) |

(52) U.S. Cl.
CPC ...... *G06F 11/1441* (2013.01); *G06F 11/0727* (2013.01); *G06F 11/0736* (2013.01); *G06F 11/2221* (2013.01); *G11C 7/1096* (2013.01); *G11C 7/20* (2013.01); *G11C 29/10* (2013.01); *G06F 2201/85* (2013.01)

(58) Field of Classification Search
CPC .. G11C 29/10; G06F 11/0727; G06F 11/0726; G06F 11/1441; G06F 11/2221
See application file for complete search history.

(56) References Cited

U.S. PATENT DOCUMENTS

| | | | | |
|---|---|---|---|---|
| 5,630,044 | A * | 5/1997 | Suzuki | ................... G11C 29/88 714/5.1 |
| 2019/0034273 | A1* | 1/2019 | Srinivasan | .......... G06F 11/1441 |
| 2019/0080111 | A1* | 3/2019 | Patange | ................. G06F 3/0659 |
| 2021/0256349 | A1* | 8/2021 | Bielby | ................. G06N 3/0427 |

FOREIGN PATENT DOCUMENTS

| | | |
|---|---|---|
| JP | 2011509065 A | 3/2011 |
| WO | 2009088500 A1 | 7/2009 |

* cited by examiner

*Primary Examiner* — Michael Maskulinski
(74) *Attorney, Agent, or Firm* — Tarolli, Sundheim, Covell & Tummino LLP

(57) ABSTRACT

An anomaly detector includes a writing unit that writes anomaly detection data readable by an external diagnostic device to an external memory when an anomaly is detected in an on-board device. Further, the anomaly detector includes a determination unit that determines whether a failure is occurring in a memory, which is used when a processor is operated during the writing unit performs the writing. Also, the anomaly detector includes a resetting unit that resets the memory by activating a specified one of reset functions of the processor when the determination unit determines that a failure is occurring in the memory. When the determination unit determines that a failure is occurring in the memory, the writing unit writes the anomaly detection data after the memory is reset by the specified one of the reset functions.

5 Claims, 2 Drawing Sheets

ANOMALY DETECTOR

RELATED APPLICATIONS

The present invention is a Nonprovisional application under 35 USC 111(a), claiming priority to Serial No. JP 2020-075208, filed on 21 Apr. 2020, the entirety of which is incorporated herein by reference.

BACKGROUND

1. Field

The following description relates to an anomaly detector.

2. Description of Related Art

A known anomaly detector detects an anomaly in an on-board device that is installed in a vehicle. Japanese National Phase Laid-Open Patent Publication No. 2011-509065 describes an anomaly detector that writes anomaly detection data to a storage device when an anomaly is detected. The anomaly detection data indicates the contents of the anomaly. The anomaly detection data written to the storage device is read by an external diagnostic apparatus.

SUMMARY

In the anomaly detector, if a failure is occurring in a memory that is used during operation of a processor, the anomaly detection data cannot be written correctly. This will lower the reliability of the anomaly detector.

One objective of the following description is to provide an anomaly detector having improved reliability.

This Summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter.

In one general aspect, an anomaly detector includes a writing unit, a determination unit, and a resetting unit. The writing unit writes anomaly detection data readable by an external diagnostic device to a storage device when an anomaly is detected in a detection subject. The determination unit determines whether a failure is occurring in a memory that is used when a processor is operated during the writing of the anomaly detection data by the writing unit. The resetting unit resets the memory by activating a specified one of reset functions of the processor when the determination unit determines that a failure is occurring in the memory. When the determination unit determines that a failure is occurring in the memory, the writing unit writes the anomaly detection data after the memory is reset by the specified one of the reset functions.

The anomaly detector of the present description improves reliability.

Other features and aspects will be apparent from the following detailed description, the drawings, and the claims.

BRIEF DESCRIPTION OF THE DRAWINGS

Throughout the drawings and the detailed description, the same reference numerals refer to the same elements. The drawings may not be to scale, and the relative size, proportions, and depiction of elements in the drawings may be exaggerated for clarity, illustration, and convenience.

DETAILED DESCRIPTION

This description provides a comprehensive understanding of the methods, apparatuses, and/or systems described. Modifications and equivalents of the methods, apparatuses, and/or systems described are apparent to one of ordinary skill in the art. Sequences of operations are exemplary, and may be changed as apparent to one of ordinary skill in the art, with the exception of operations necessarily occurring in a certain order. Descriptions of functions and constructions that are well known to one of ordinary skill in the art may be omitted.

Exemplary embodiments may have different forms, and are not limited to the examples described. However, the examples described are thorough and complete, and convey the full scope of the disclosure to one of ordinary skill in the art.

An embodiment of an anomaly detector will now be described with reference to the drawings.

Figure 1:
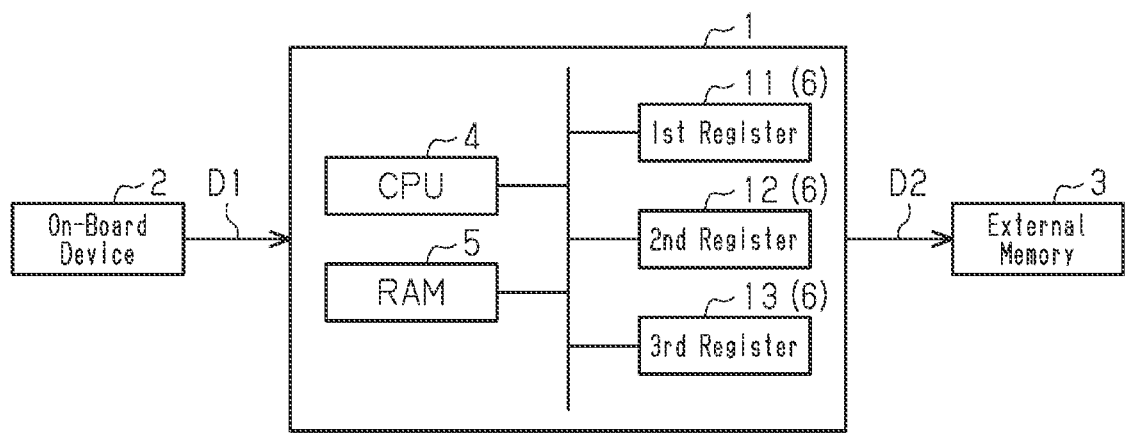
FIG. 1 is a block diagram showing the configuration of an anomaly detector.

As shown in FIG. 1, an anomaly detector 1 is connected to, for example, multiple on-board devices 2 installed in a vehicle. Each on-board device 2 corresponds to a detection subject. Examples of the on-board device 2 include a door lock device that locks and unlocks a vehicle door, an engine device that starts an engine, a transmission device that controls a transmission, and the like. The anomaly detector 1 detects whether an anomaly is occurring in the on-board device 2 with, for example, a sensor or the like of the on-board device 2.

When an anomaly is detected in the on-board device 2, the anomaly detector 1 stores anomaly detection data D2 in an external memory 3 that serves as a storage device. The external memory 3 includes a storage space that is readable by an external diagnostic device (not shown). The external memory 3 is, for example, a rewritable, non-volatile memory.

The anomaly detector 1 includes a control processing unit (CPU) 4 serving as a processor, a random-access memory (RAM) 5 serving as a memory, and registers 6 serving as reset functions. The RAM 5 is used during operation of the processor. The CPU 4 performs a writing process of the anomaly detection data D2 using the RAM 5. More specifically, the RAM 5 is used as a working space of the CPU 4 when the anomaly detection data D2 is written. The RAM 5 is, for example, a volatile memory.

The registers 6 include a first register 11, a second register 12, and a third register 13. The first register 11 is used when resetting an electronic circuit that is separate from the RAM 5. The second register 12 is a dedicated register used only for resetting the RAM 5. The second register 12 corresponds to a specified reset function. The third register 13 is a special function register (SFR) that stores a determination result of whether the RAM has been reset by the second register 12.

Figure 2:
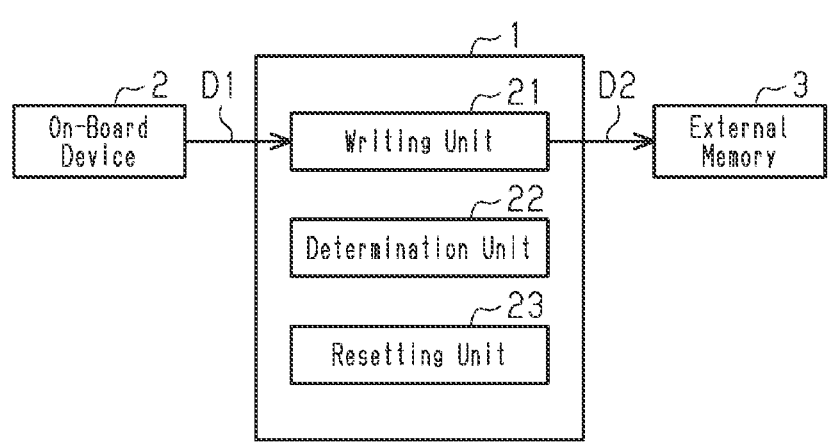
FIG. 2 is a functional block diagram of the anomaly detector shown in FIG. 1.

As shown in FIG. 2, the anomaly detector 1 includes multiple functions implemented by executing programs stored in a read-only memory (ROM, not shown) with the CPU 4. The anomaly detector 1 includes a writing unit 21, a determination unit 22, and a resetting unit 23 serving as the functions. The writing unit 21 performs the writing process of the anomaly detection data D2. The determination unit 22 determines whether there is a failure in the RAM 5. The resetting unit 23 resets the RAM 5.

The writing unit 21 receives detection information D1 through communication established with the on-board device 2. When the detection information D1 is received, the writing unit 21 detects an anomaly in the on-board device 2 from the detection information D1. The detection information D1 may be, for example, a sensor value of the on-board device 2 or a signal notifying the occurrence of an anomaly. The writing unit 21 repetitively receives the detection information D1 in a cyclic or non-cyclic manner.

When an anomaly is detected in the on-board device 2, the writing unit 21 generates the anomaly detection data D2 that indicates the contents of the anomaly. The anomaly detection data D2 includes the subject on-board device 2, a fault code indicating a type of anomaly (fault), a diagnostic trouble code (DTC), the date and time of the occurrence of the anomaly, and the like. The writing unit 21 writes the generated anomaly detection data D2 to the external memory 3. The RAM 5 is used as the working space of the CPU 4 in at least part of the series of writing process such as the detection of an anomaly, the generation of the anomaly detection data D2, and the writing of the anomaly detection data D2.

The determination unit 22 determines whether a failure is occurring in the RAM 5, for example, whenever the writing unit 21 performs the writing process of the anomaly detection data D2. A failure in the RAM 5 includes, for example, a fault such as the polarization of electric charges that occurs within the RAM 5, or a fault such as garbled numeric values that occurs due to an external factor such as a magnetic field. When the determination unit 22 determines that there is no failure in the RAM 5, the writing unit 21 writes the anomaly detection data D2.

When the determination unit 22 determines that there is a failure in the RAM 5, the resetting unit 23 resets the RAM 5. The resetting unit 23 resets the RAM 5 using the second register 12. The second register 12 is used only when the determination unit 22 determines that a failure is occurring in the RAM 5. Preferably, the RAM 5 is reset by an initialization process performed on the RAM 5.

When the determination unit 22 determines that there is a failure in the RAM 5, the writing unit 21 determines whether the RAM 5 has been reset by the second register 12. When the determination unit 22 determines that there is a failure in the RAM 5, the writing unit 21 will not write the anomaly detection data D2 until the RAM 5 is reset by the second register 12.

The writing unit 21 determines whether the RAM 5 has been reset by the second register 12 by checking the third register 13. In other words, the writing unit 21 checks whether the resetting was caused by the second register 12. Further, in the present embodiment, after the writing unit 21 determines that the RAM 5 has been reset, the determination unit 22 determines again whether a failure is occurring in the RAM 5. When the writing unit 21 confirms that the RAM 5 has been reset by the second register 12 and the determination unit 22 determines that there is no failure in the RAM 5, the writing unit 21 writes the anomaly detection data D2.

The operation of the present embodiment will now be described.

Figure 3:
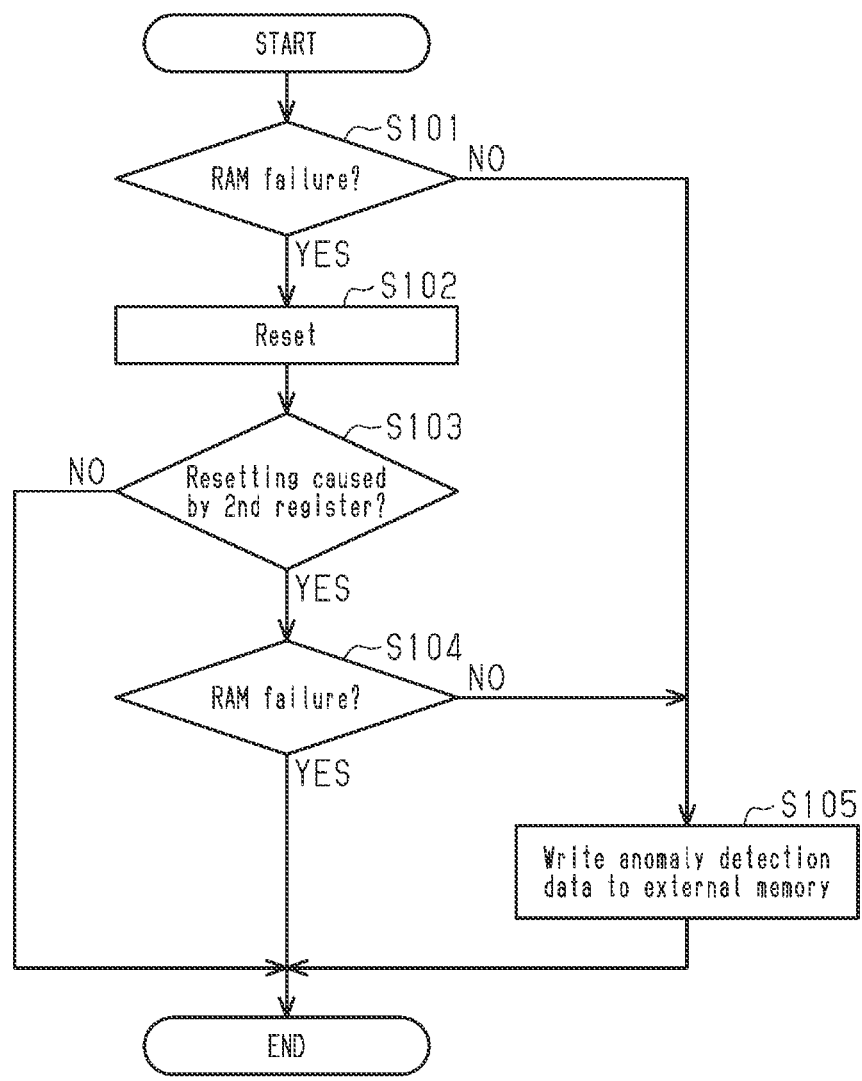
FIG. 3 is a flowchart illustrating the actuation of the anomaly detector shown in FIG. 1.

As shown in FIG. 3, in S101 (S represents step), the determination unit 22 determines whether a failure is occurring in the RAM 5. The determination unit 22 performs a failure determination on the RAM 5, for example, when the determination unit 22 receives the detection information D1 from the on-board device 2. The determination unit 22 detects a failure in the RAM 5, for example, by writing a predetermined numeric value to the RAM 5 and checking whether the written numeric value can be correctly read from the RAM 5. When the determination unit 22 determines that there is a failure in the RAM 5, the determination unit 22 proceeds to S102. When there is no failure in the RAM 5, the determination unit 22 proceeds to S105.

In S102, the resetting unit 23 resets the RAM 5. The resetting of the RAM 5 is, for example, a process that initializes (zero-clears) the RAM 5. The RAM 5 is reset when the second register 12 outputs a reset signal to, for example, a predetermined port of the RAM 5. In this case, the third register 13 receives the reset signal of the second register 12. The output state of the third register 13 is shifted, for example, when a reset signal of the second register 12 is received. In this manner, the third register 13 stores the determination result of whether the RAM 5 has been reset by the second register 12.

In S103, the writing unit 21 determines whether the resetting of the RAM 5 was caused by the second register 12 by checking the output state of the third register 13. When the writing unit 21 confirms that the resetting factor is the second register 12, the writing unit 21 proceeds to S104. When the resetting factor is not the second register 12, the writing unit 21 ends the process.

In S104, the determination unit 22 determines again whether a failure is occurring in the RAM 5. When the determination unit 22 determines that there is a failure in the RAM 5, the determination unit 22 ends the process. In this case, the anomaly detection data D2 will not be written. When there is no failure in the RAM 5, the determination unit 22 proceeds to S105.

In S105, the writing unit 21 performs the writing process of the anomaly detection data D2. The writing unit 21 generates the anomaly detection data D2 based on the detection information D1. Then, the writing unit 21 writes the generated anomaly detection data D2 to the external memory 3. The anomaly detection data D2 stored in the external memory 3 will be read by an external diagnostic device. This allows the contents of the anomaly occurring in the on-board device 2 to be checked by the external diagnostic device.

As described above, when a failure is occurring in the RAM 5, the writing unit 21 writes the anomaly detection data D2 after the RAM 5 is reset by the resetting unit 23. If the failure in the RAM 5 can be resolved by resetting the RAM 5, erroneous anomaly detection data D2 writing and writing errors resulting from the failure of the RAM 5 will be avoided. This improves the reliability of the anomaly detector 1.

The resetting unit 23 of the present embodiment resets the RAM 5 using the dedicated second register 12, which is used only when a failure is detected in the RAM 5. This avoids a situation in which the anomaly detector 1 erroneously resets the RAM 5 in a different process.

In addition to the second register 12, the resetting of the RAM 5 is caused by, for example, the stopping and starting of the supply of power to the entire detector, the input of an external reset signal, and the like. In the present embodiment, the third register 13 is used to determine whether resetting has been performed by the second register 12.

The writing unit 21 determines whether the resetting of the RAM 5 was caused by the second register 12 by checking the third register 13. This allows the writing of data to be performed when a failure is occurring in the RAM 5 after confirming that the RAM 5 has been reset correctly.

Further, the resetting of the RAM 5 by the second register 12 can be checked with the third register 13, which is a storage space separate from the RAM 5.

After the RAM 5 is reset, when the determination unit 22 performs a failure determination and confirms again that a failure is not occurring in the RAM 5, the writing unit 21 writes the anomaly detection data D2. This allows data to be written after recovery of the RAM 5 resulting from resetting is confirmed.

(1) The anomaly detector 1 includes the writing unit 21 that writes the anomaly detection data D2, which is readable by an external diagnostic device, to the external memory 3 when an anomaly is detected in the on-board device 2. Further, the anomaly detector 1 includes the determination unit 22 that determines whether a failure is occurring in the RAM 5, which is used during operation of the CPU 4, when the writing unit 21 performs the writing process. Further, the anomaly detector 1 includes the resetting unit 23 that activates one of the registers 6 related to the functions of the CPU 4, namely, the second register 12, to reset the RAM 5 when the determination unit 22 determines that there is a failure in the RAM 5. Furthermore, when the determination unit 22 determines that there is a failure in the RAM 5, the writing unit 21 writes the anomaly detection data D2 after the RAM 5 is reset by the second register 12. If the failure in the RAM 5 is resolved by resetting the RAM 5, the writing of erroneous anomaly detection data D2 or writing errors resulting from the failure of the RAM 5 will be avoided. This improves the reliability of the anomaly detector.

(2) The second register 12 is related to the dedicated resetting function that is used only when the determination unit 22 determines that there is a failure in the RAM 5. This avoids a situation in which the anomaly detector 1 erroneously resets the RAM 5 in a different process. Thus, the reliability of the anomaly detector is improved.

(3) The writing unit 21 determines whether the RAM 5 has been reset by the second register 12 by checking the third register 13, which stores inputs from the second register 12. This allows data to be written after confirming that the RAM 5 has been reset correctly.

(4) The resetting of the RAM 5 includes initialization of the RAM 5. This allows the RAM 5 to recover from the failure through initialization, which is a simple process.

(5) The memory used during operation of the processor is the RAM 5, which is used as the working space of the processor. This configuration can be applied to a device that uses the RAM as the working space of a processor.

(6) After the RAM is reset, the determination unit 22 performs again determination of whether a failure is occurring in the RAM 5. Further, when it is confirmed that a failure is not occurring in the RAM 5, the writing unit 21 writes the anomaly detection data D2. This allows data to be written after confirming recovery of the RAM 5 resulting from resetting. Thus, the reliability of the anomaly detector is further improved.

The present embodiment may be modified as follows. The present embodiment and the following modifications can be combined as long as the combined modifications remain technically consistent with each other.

The determination unit 22 does not have to perform a failure determination again after the RAM 5 is reset. This may be changed in accordance with the specification.

The initialization performed to reset the RAM 5 is not limited to only the initialization of the RAM 5. For example, the RAM 5 may be reset by stopping and starting the supply of power to the entire detector including the RAM 5.

Further, the resetting of the RAM 5 includes changing the state of the RAM 5 to a predetermined state.

The RAM 5 may be reset by outputting a reset signal from the second register 12 to a predetermined port of the RAM 5 or outputting a signal from the second register 12 to actuate a reset circuit that is separate from the second register 12. In this manner, the RAM 5 may be reset in any manner.

Memory resetting performed by the second register 12 does not have to be checked by the third register 13, which is a special function register, and may be checked by a versatile register or a memory differing from the RAM 5.

The second register 12 is not limited to a dedicated register used only when there is a failure in the RAM 5. Alternatively, a versatile register or other types of registers may be used as the second register 12.

The first register 11 may reset the second register 12 and the third register 13. The first register 11 may also reset other circuits.

The determination unit 22 may perform a failure determination before the detection information D1 is input, before the anomaly detection data D2 is generated, or before the anomaly detection data D2 is written. That is, a failure determination may be performed at any point in time during the writing process. Also, a failure determination may be performed cyclically or in a manner irrelevant with the writing process.

The writing unit 21 does not have to generate the anomaly detection data and may function to only write the anomaly detection data to the external memory 3.

The anomaly detection data is not limited to DTC, and may be other data, such as a detection value of a sensor arranged in the on-board device 2, as long as the data is readable by an external diagnostic device.

The occurrence of an anomaly in the on-board device 2 may be determined by the on-board device 2 or the anomaly detector 1.

The storage device to which the anomaly detection data D2 is written is not limited to the external memory 3 and may be arranged in the anomaly detector 1.

The memory used during operation of the processor is not limited to the RAM 5 and various types of storages may be used. Further, the memory may be a volatile memory or a non-volatile memory.

The anomaly detector 1 does not have to be arranged in a vehicle and may be applied to various types of devices.

The present description includes the following example. Reference numerals of the components of the exemplary embodiment are given to facilitate understanding and not to limit the scope of the invention. Some of the components described in the following example may be omitted or combined.

Embodiment 1

An anomaly detector (1), including:
one or more processors (4); and
a non-transitory memory (corresponding to ROM, not shown) connected to the one or more processors (4) and storing commands executable by the one or more processors (4),
in which the one or more processors (4) execute the commands and perform;
writing anomaly detection data readable by an external diagnostic device to a storage device (3) when an anomaly is detected in a detection subject (2);

determining during the writing whether a failure is occurring in a memory (5) that is used when the one or more processors (4) are operated; and resetting the memory (5) by activating a specified one of reset functions of the one or more of processors (4) when occurrence of a failure in the memory (5) is determined, and the writing of the anomaly detection data being performed after the resetting the memory (5) with the specified one of the reset functions when determined by the one or more processors (4) that a failure is occurring in the memory (5).

Various changes in form and details may be made to the examples above without departing from the spirit and scope of the claims and their equivalents. The examples are for the sake of description only, and not for purposes of limitation. Descriptions of features in each example are to be considered as being applicable to similar features or aspects in other examples. Suitable results may be achieved if sequences are performed in a different order, and/or if components in a described system, architecture, device, or circuit are combined differently, and/or replaced or supplemented by other components or their equivalents. The scope of the disclosure is not defined by the detailed description, but by the claims and their equivalents. All variations within the scope of the claims and their equivalents are included in the disclosure.

What is claimed is:

1. An anomaly detector, comprising:
   a writing unit that writes anomaly detection data readable by an external diagnostic device to a storage device when an anomaly is detected in a detection subject;
   a determination unit that determines whether a failure is occurring in a memory that is used when a processor is operated during the writing of the anomaly detection data by the writing unit; and
   a resetting unit that resets the memory by activating a specified one of reset functions of the processor when the determination unit determines that a failure is occurring in the memory,
   wherein when the determination unit determines that a failure is occurring in the memory, the writing unit writes the anomaly detection data after the memory is reset by the specified one of the reset functions,
   wherein the specified one of the reset functions is a dedicated reset function used only when the determination unit determines that a failure is occurring in the memory.

2. The anomaly detector according to claim 1, wherein the resetting of the memory includes initialization of the memory.

3. The anomaly detector according to claim 1, wherein the memory is a random-access memory used as a working space of the processor.

4. An anomaly detector, comprising:
   a writing unit that writes anomaly detection data readable by an external diagnostic device to a storage device when an anomaly is detected in a detection subject;
   a determination unit that determines whether a failure is occurring in a memory that is used when a processor is operated during the writing of the anomaly detection data by the writing unit; and
   a resetting unit that resets the memory by activating a specified one of reset functions of the processor when the determination unit determines that a failure is occurring in the memory,
   wherein when the determination unit determines that a failure is occurring in the memory, the writing unit writes the anomaly detection data after the memory is reset by the specified one of the reset functions,
   wherein the writing unit determines whether the memory has been reset by the specified one of the reset functions by checking a special function register that stores an input from the specified one of the reset function.

5. An anomaly detector, comprising:
   a writing unit that writes anomaly detection data readable by an external diagnostic device to a storage device when an anomaly is detected in a detection subject;
   a determination unit that determines whether a failure is occurring in a memory that is used when a processor is operated during the writing of the anomaly detection data by the writing unit; and
   a resetting unit that resets the memory by activating a specified one of reset functions of the processor when the determination unit determines that a failure is occurring in the memory,
   wherein when the determination unit determines that a failure is occurring in the memory, the writing unit writes the anomaly detection data after the memory is reset by the specified one of the reset functions,
   wherein the determination unit determines again whether a failure is occurring in the memory after the memory is reset, and the writing unit writes the anomaly detection data when the determination unit determines and confirms again that a failure is not occurring in the memory.

* * * * *